United States Patent [19]

Okuno

[11] Patent Number: 5,515,526
[45] Date of Patent: May 7, 1996

[54] APPARATUS FOR DETECTING REDUNDANT CIRCUIT INCLUDED IN LOGIC CIRCUIT AND METHOD THEREFOR

[75] Inventor: Yoshihiro Okuno, Hyogo, Japan

[73] Assignee: Mitsubishi Denki Kabushiki Kaisha, Tokyo, Japan

[21] Appl. No.: 214,996

[22] Filed: Mar. 21, 1994

Related U.S. Application Data

[63] Continuation of Ser. No. 678,871, Apr. 4, 1991, abandoned.

[30] Foreign Application Priority Data

Apr. 6, 1990 [JP] Japan ................................. 2-92634

[51] Int. Cl.$^6$ ............................................... G06F 9/455
[52] U.S. Cl. ........................ 395/500; 364/489; 364/DIG. 1
[58] Field of Search .................................. 364/488, 489, 364/490, 491; 395/500

[56] References Cited

U.S. PATENT DOCUMENTS

| | | | |
|---|---|---|---|
| 4,602,339 | 7/1986 | Aihara et al. | 364/490 |
| 4,769,817 | 9/1988 | Krohn et al. | |
| 4,801,870 | 1/1989 | Eichelberger et al. | |
| 4,816,999 | 3/1989 | Berman et al. | 364/489 |
| 4,960,724 | 10/1990 | Watanabe et al. | 437/51 |

OTHER PUBLICATIONS

"LSI Chip Design for Testability", 1978 IEEE International Solid–State Circuits Conference, by Sumit Das Gupta et al, pp. 216–217.

"Outline of Data Base Pointed to Hierarchy Design and Hierarchy Design and Process by Hierarchy Development" Information Processing Society of Japan, by Morio Kakinuma et al, Oct. 29, 1982, pp. 1–7.

"Integrated CAD System for Custom LSI (2), Hierarchy Directional Data Base", National Convention of information processing Society of Japan, Morio Kakinuma et al, pp. 1281–1282, 1982.

Kakinuma et al., "Outline of Data Base Pointed to Hierarchy Design and Process by Hierarchy Development," Design Automation 14–4, Oct. 29, 1982, pp. 1–7.

Kakinuma et al., "Integrated CAD System for Custom LSI (2)," 25th National Convention of Information Processing Society of Japan, pp. 1281–1282.

Session XVI: LSI Design, Testing and Interfacing, "LSI Chip Design for Testability", 1978 IEEE International Solid–State Circuits Conference, pp. 216–217.

Primary Examiner—William M. Treat
Attorney, Agent, or Firm—Lowe, Price, LeBlanc & Becker

[57] ABSTRACT

A logic circuit optimizing apparatus for optimizing a designed logic circuit including a redundant circuit is disclosed. Conventionally, a large number of operations and limitations have been necessary in designing thereof, in order to detect faults included in the designed logic circuit, and the complete detection of the faults was impossible. The logic circuit optimizing apparatus, however, includes the steps of detecting a redundant circuit included in a designed logic circuit (55 to 59), and the step of deleting the detected redundant circuit (62) and, therefore, the redundant circuit can be completely removed from the designed logic circuit. A logic circuit without faults can be thus designed, and the complete detection of faults can be performed.

10 Claims, 6 Drawing Sheets

APPARATUS FOR DETECTING REDUNDANT CIRCUIT INCLUDED IN LOGIC CIRCUIT AND METHOD THEREFOR

This application is a continuation of application Ser. No. 07/678,871 filed Apr. 4, 1991, now abandoned.

BACKGROUND OF THE INVENTION

1. Field of the Invention

The present invention relates generally to redundant circuit detecting apparatuses, and in particular, to a redundant circuit detecting apparatus for detecting a redundant circuit included in a logic circuit utilizing logic simulation. The present invention has particular applicability to a logic circuit optimization apparatus for optimizing a designed logic circuit.

2. Description of the Background Art

Generally, in designing a semiconductor integrated circuit, a computer aided design system (referred to as "CAD system" hereinafter) is often used. According to the CAD system, a designer designs a logic circuit which fulfills required circuit functions, using a CRT display unit, and then logic simulation is conducted in the designed logic circuit, using test data. When a desired test result is obtained, it is determined that the designed logic circuit fulfills the necessary functions. The fulfillment of the necessary logic functions by the designed logic circuit does not necessarily mean the circuit is optimized. In other words, a redundant circuit often exists in the designed circuit. The presence of the redundant circuit can give rise to the following problems. Area occupied by the logic circuit on a semiconductor substrate increases and, therefore, high density integration of the semiconductor integrated circuit is prevented. Additionally, it is pointed out that complete detection of faults in the designed logic circuit cannot be achieved, because of inability to detect potential faults in the redundant circuit. Generally, the logic circuit cannot operate normally when a fault exists in the logic circuit. The logic circuit does operate normally, however, even when a fault exists in a redundant circuit included in the logic circuit.

As one method of detecting a fault in a redundant circuit included in a designed logic circuit, a method has been conventionally known, which performs fault simulation preparing and using test data other than test data to be used in logic circuit simulation. A large number of operations are however necessary for the preparation, because test data for logic simulation should be prepared for every logic circuit designed in various manners. Furthermore, faults still cannot be detected in the redundant circuit in some cases.

Figure 1:
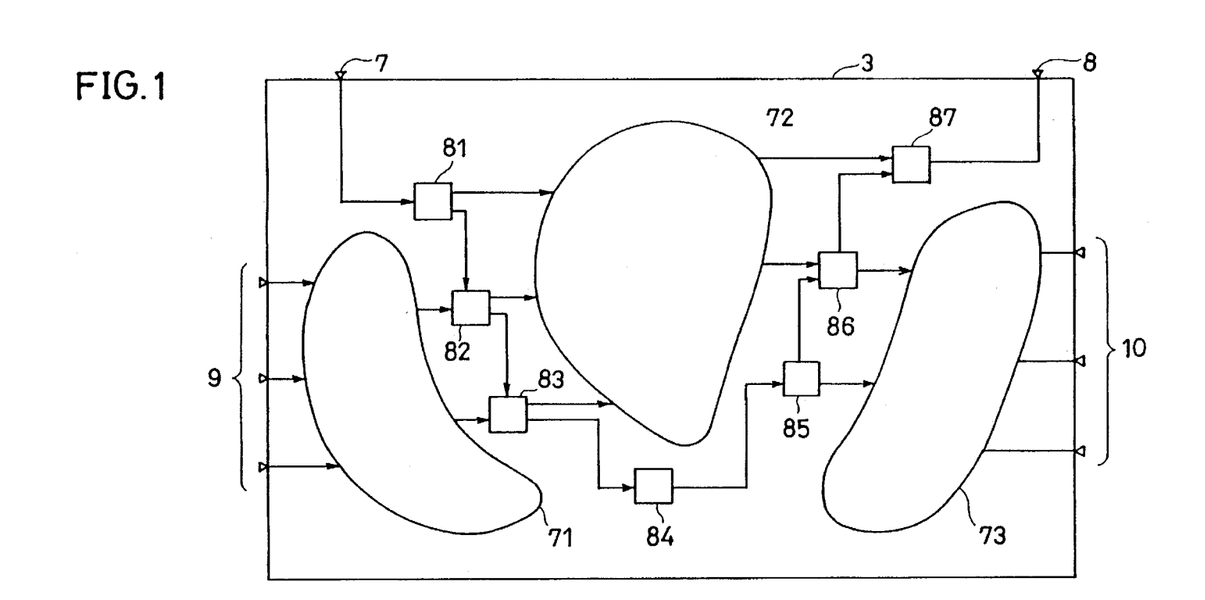
FIG. 1 is a schematic diagram showing a logic circuit designed in accordance with Level Sensitive Scan Design (LSSD)

Another method is known, according to which a logic circuit is designed to have a higher fault detecting rate, by utilizing a designing method called Level Sensitive Scan Design (referred to as "LSSD" hereinafter). Referring to FIG. 1, a logic circuit 3 designed according to the LSSD includes three internal circuits 71, 72, 73 and shift registers 81 to 87 connected in series between a serial input 7 and a serial output 8. The shift registers 81 to 87 constitute a scan path. The internal circuit 71 receives parallel input data through a parallel input 9. The internal circuit 73, on the other hand, outputs parallel output data through a parallel output 10. When the logic circuit 3 is designed according to the LSSD, the following restrictions exist. Level sensitive shift registers to respond to a 2-phase clock signal to operate should be used, as the shift registers 81 to 87 constituting the scan path. In addition, desired logic functions should be implemented by a combination of the internal circuits 71, 72 and 73. The restrictions are described in detail in an article by S. DasGupta et al entitled "LSI Chip Design for Testability" (ISSCC DIGEST OF TECHNICAL PAPER, February, 1978, pp. 216–217). In addition to the above mentioned restrictions, it is pointed out that the scale of a circuit is increased by about 20% when the logic circuit is designed according to the LSSD.

SUMMARY OF THE INVENTION

One object of the present invention is to design logic circuit in an optimized manner.

Another object of the present invention is perform complete detection of faults in the designed logic circuit.

A further object of the present invention is to provide redundant circuitry detecting apparatus for detecting redundant circuit included in the designed logic circuitry.

Yet another object of the present invention is to provide logic circuit optimizing apparatus for optimizing the logic circuit including the redundant circuit.

Briefly stated, the redundant circuit detecting apparatus in accordance with the present invention includes first logic simulation executing means for executing logic simulation of the logic circuit including the redundant circuit utilizing prescribed test data, internal node selecting means for selecting one internal node in the logic circuit, pseudo fault setting means for setting a pseudo fault in the selected internal node, second logic simulation executing means for executing logic simulation in the logic circuit including the pseudo fault utilizing the test data, and coincidence detecting means for detecting the coincidence between first and second output data each output from the first and second logic simulation executing means.

In operation, the first logic simulation executing means, using the test data, generates the first output data by executing logic simulation in the logic circuit. The pseudo fault setting means sets a pseudo fault in the selected internal node, and then the second logic simulation executing means generates, using the test data, the second output data by executing logic simulation in the logic circuit including the pseudo fault. If the coincidence detecting means detects the coincidence between the first and second output data, it is determined that a redundant circuit is connected to the selected internal node.

In accordance with another aspect of the present invention, a logic circuit optimizing apparatus includes first logic simulation executing means for executing logic simulation in the logic circuit utilizing prescribed test data, internal node selecting means for selecting one internal node in the logic circuit, pseudo fault setting means for setting a pseudo fault in the selected internal node, second logic simulation executing means for executing logic simulation in the logic circuit including the pseudo fault, coincidence detecting means for detecting the coincidence between first and second output data each generated from the first and second logic simulation means, and deleting means for deleting the part of the circuit which supplies an output signal to the selected internal node, in response to the coincidence detecting means.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
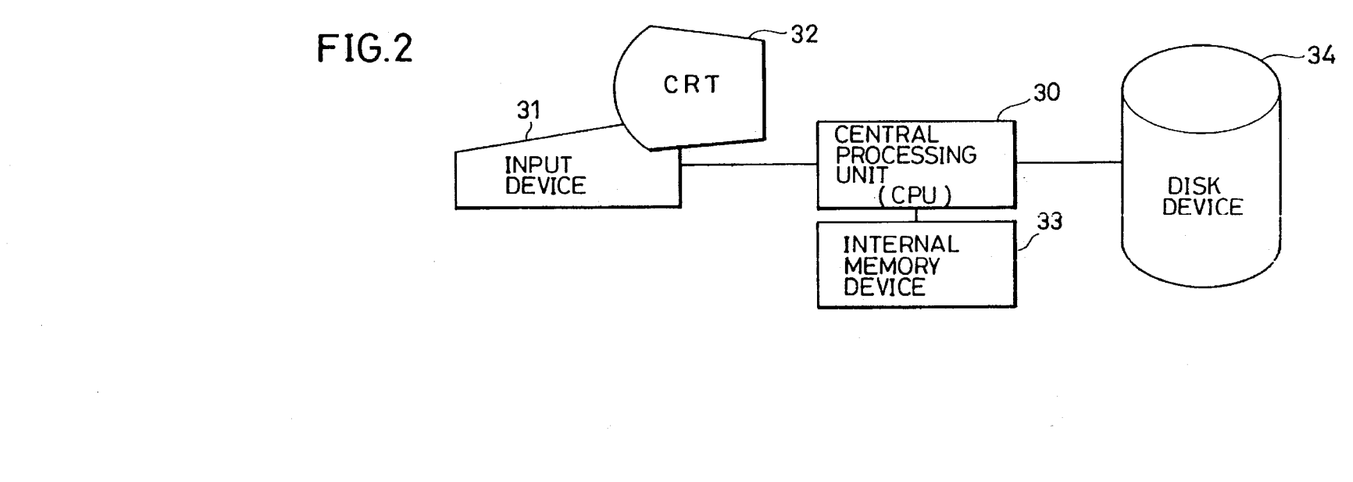
FIG. 2 is a block diagram showing hardware for designing logic circuits in accordance with Computer Aided Design (CAD) to which the present invention can be applied.

Referring to FIG. 2, Computer Aided Design (CAD) system, to which a logic circuit optimizing apparatus in accordance with the present invention can be applied, includes a central processing unit (CPU) 30, an input device 31 for designing operation by a designer using a CRT display unit 32, an internal memory device 33 connected to the central processing unit 30, and a disk device 34 as an external memory device. The logic circuit optimizing apparatus representing an example of the present invention is implemented in the CAD system shown in FIG. 2.

Figure 3A:
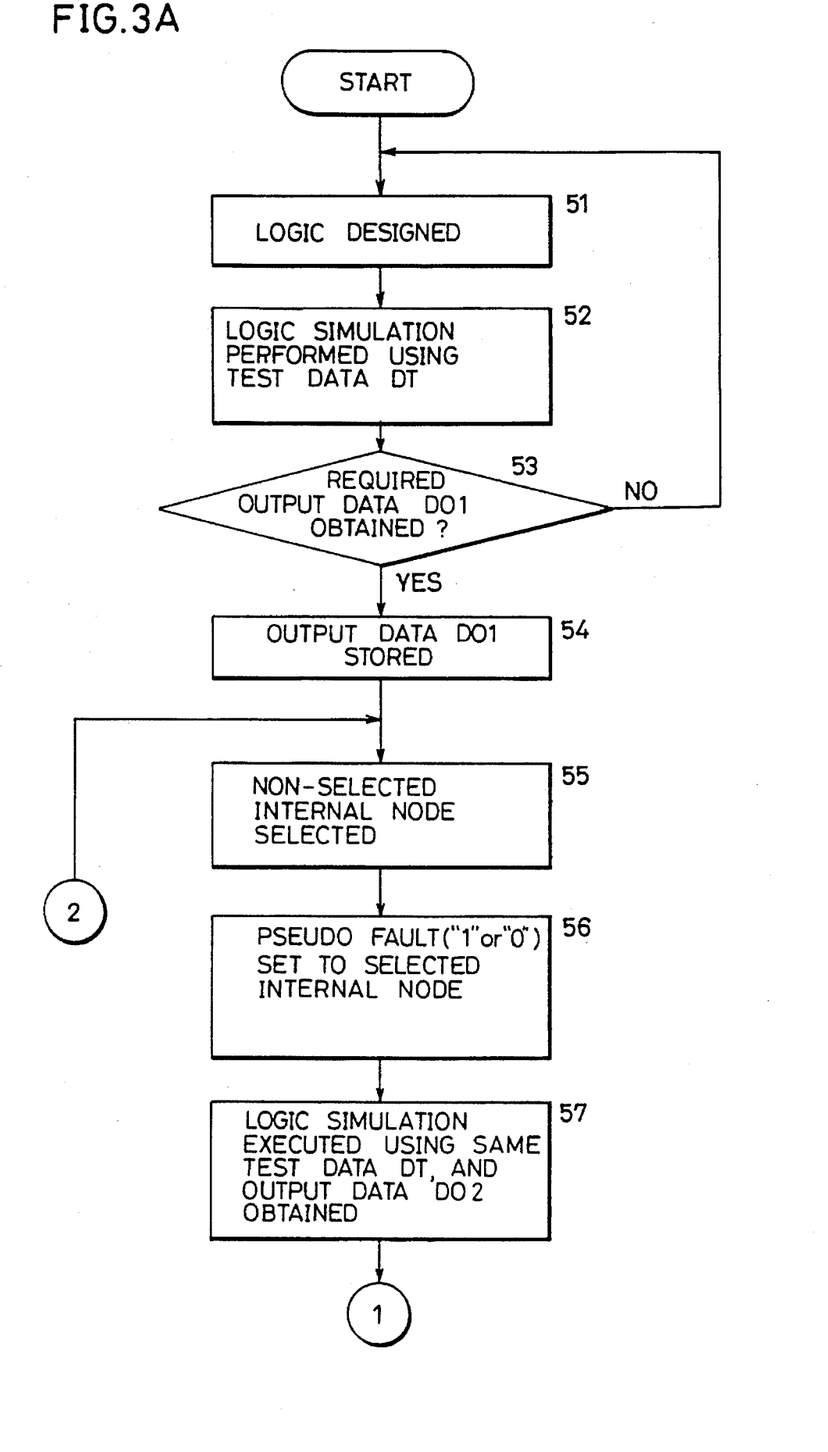
FIGS. 3A and 3B are flow charts of a logic circuit optimizing apparatus showing an embodiment of the present invention.
Figure 3B:
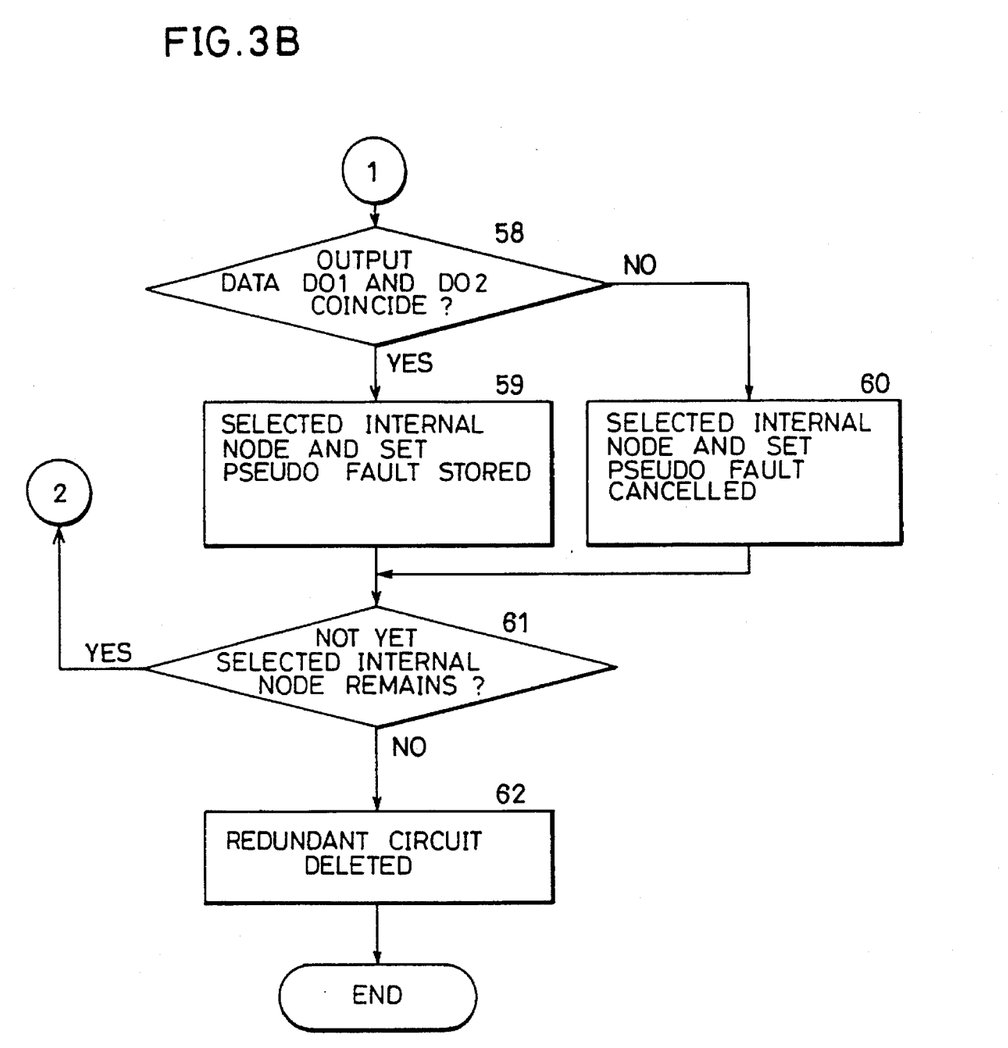

Referring to FIGS. 3A to 3B, process by the logic circuit optimizing apparatus will be described below. In step 51, a designer designs a logic circuit having desired logic functions utilizing the input device 31. In step 52, logic simulation is executed utilizing prescribed test data DT. After the execution of the logic simulation, in step 53, it is determined whether required output data DO1 is obtained or not. If the required output data DO1 is not obtained, the process returns to step 51 and starts logic designing all over again. If the required output data DO1 is obtained, the output data DO1 is stored in step 54.

Figure 4A:
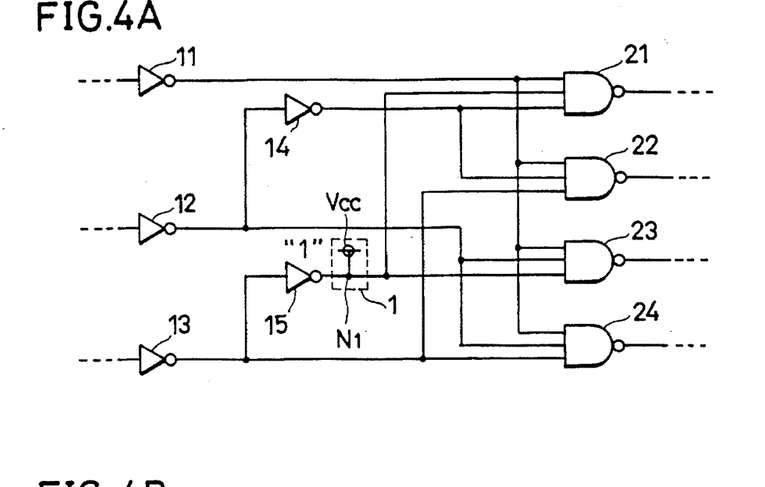
FIGS. 4A to 4C are circuit diagrams showing the processing when a pseudo fault "1" is set.

In step 55, one internal node in the designed logic circuit is selected. Assuming, for example, the logic circuit shown in FIG. 4A is designed, the output node N1 of an inverter 15 is selected as an internal node. In step 56, a pseudo fault is set at the selected internal node N1. In other words, a voltage representing either logic "1" or "0" is applied to the internal node as the pseudo fault. In the example shown in FIG. 4A, the logic "1" is set as the pseudo fault and, therefore, the node N1 is connected to the power supply Vcc. In other words, the potential of the node N1 is fixed at the power supply voltage Vcc. The circuit shown in FIG. 4A is therefore represented equivalently by FIG. 4B.

Figure 4B:
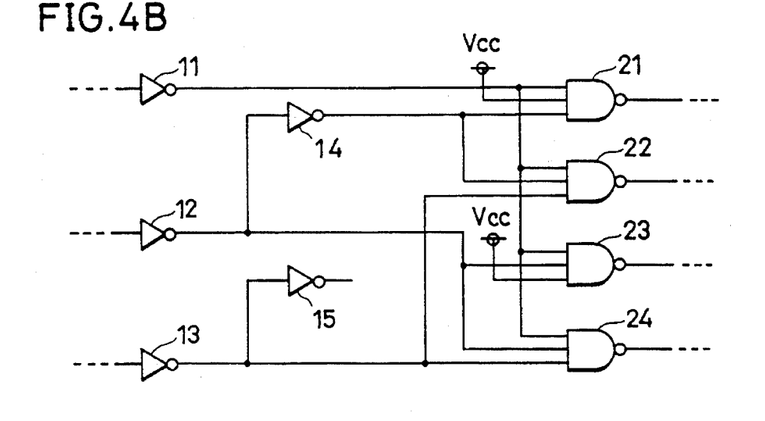

Referring to FIG. 4B, the output line of the inverter 15 is cut off, and one input of NAND gates 21 and 23 is directly connected to the power supply Vcc.

In step 57, logic simulation in the logic circuit shown in FIGS. 4A and 4B is executed utilizing the same test data as used in step 52, and output data DO2 is obtained.

Referring to FIG. 3B, in step 58, comparison is conducted between the output data DO1 stored in step 54 and the output data DO2 obtained in step 57. When the coincidence is found between the output data DO1 and DO2, the selected internal node and set pseudo fault are stored in step 59. The logic circuit shown in FIG. 4A includes a redundant circuit as the inverter 15 and, therefore, the output data DO1 and DO2 coincide. Consequently, the selected internal node N1 and the set pseudo fault "1" are stored in step 59. If the coincidence is not found between the output data DO1 and DO2, the selection of the internal node and the setting of the pseudo fault are canceled. In other words, it is determined that the circuit which supplies an output signal to the internal node is not a redundant circuit.

In step 61, it is determined whether any internal node which is not selected remains or not in the designed logic circuit. If any internal node which is not selected remains, the process returns to step 55 shown in FIG. 3A, another internal node is selected, and the process through steps 56 to 60 is repeated. After the above described process is conducted for every internal node included in the logic circuit, a redundant circuit is deleted in step 62.

Figure 4C:
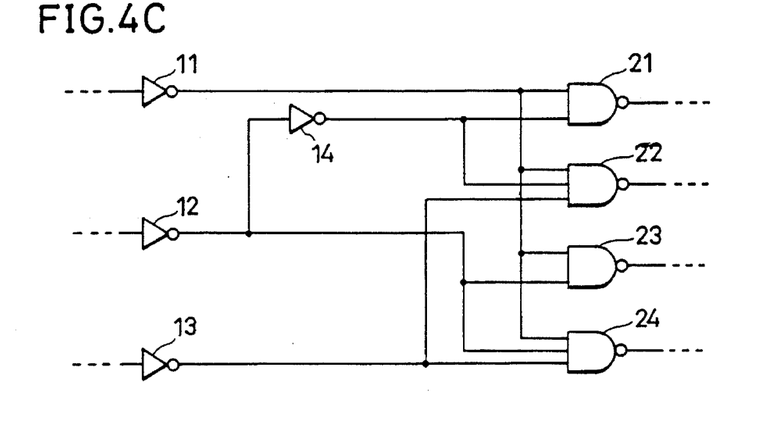

The deletion of the redundant circuit is performed based on the stored data because the selected internal node and the set pseudo fault are stored in step 59. In other words, it is determined that the part of the logic circuit which supplies an output signal to the internal node is a redundant circuit and, therefore, the redundant circuit is deleted. Additionally, the part of the circuit connected to receive the output signal through the internal node is supplied with a voltage of a fixed logic level based on the stored pseudo fault. In the example shown in FIG. 4B, a voltage Vcc representing a logic "1" is applied to one input of each of the NAND gates 21 and 23. In addition, it is determined that the inverter 15 is a redundant circuit and, therefore, is deleted as shown in FIG. 4C. A signal of logic "1" applied to the NAND gates 21 and 23 does not influence the output signals at all and, therefore, the connection between NAND gates 21 and 23 and the supply Vcc is deleted as shown in FIG. 4C. It is to be understood that the designed logic circuit shown in FIG. 4A is simplified, i.e., optimized by deleting the redundant circuit.

Figure 5A:
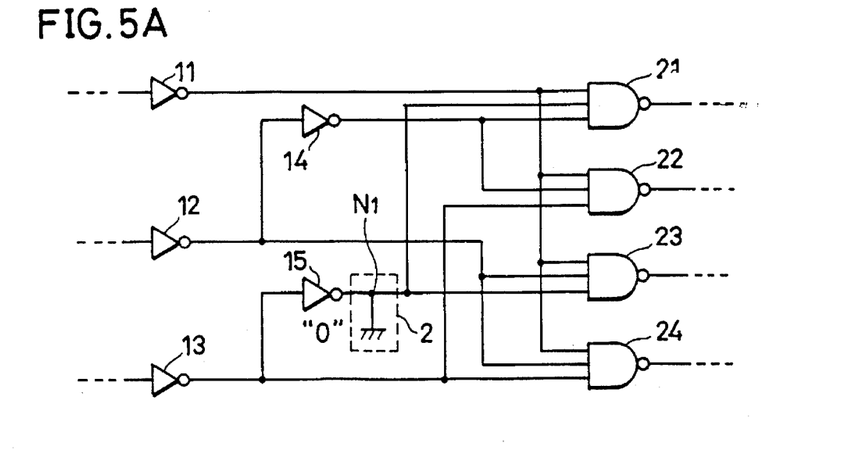
FIGS. 5A to 5C are circuit diagrams showing the processing when a pseudo fault "0" is set.
Figure 5B:
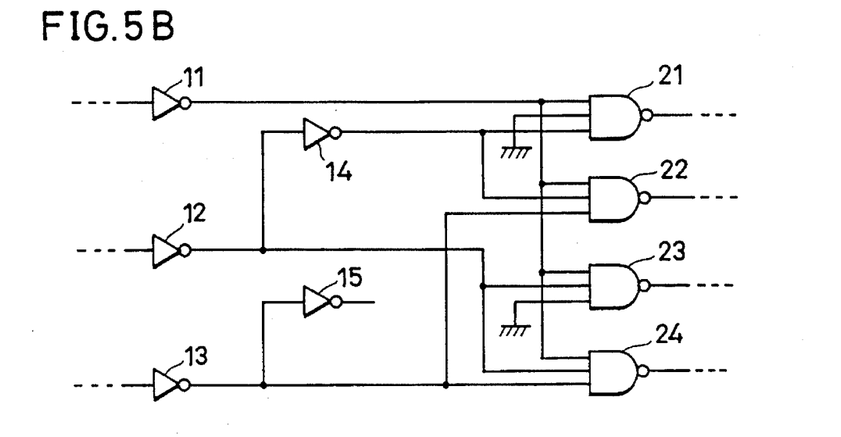
Figure 5C:
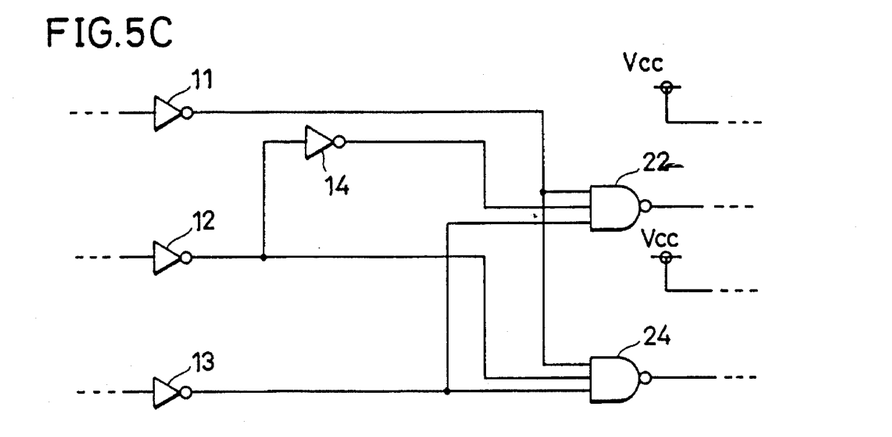

An example in which a pseudo fault "0" is set in the selected internal node in step 56 is shown in FIGS. 5A and 5C. Referring to FIG. 5A, the pseudo fault "0" is connected to the selected internal node N1. In other words, the node N1 is grounded. By setting the pseudo fault "0", the logic circuit shown in FIG. 5A is shown equivalently by FIG. 5B. The output of the inverter 15 is cut off and one input of each of the NAND gates 21 and 23 is grounded. Logic simulation is executed with respect to the circuit in step 57 by utilizing the test data DT. In the example, because the output data DO1 and DO2 coincide in step 58, the inverter 15 is deleted as a redundant circuit as shown in FIG. 5C in step 62. Additionally, each of the NAND gates 21 and 23 having one input grounded, always outputs a voltage of the power supply Vcc level. The NAND gates 21 and 23 are therefore deleted in FIG. 5C and the output lines of the deleted NAND gates 21 and 23 are connected directly to the power supply Vcc. As a result, the designed logic circuit shown in FIG. 5A is simplified i.e. optimized as shown in FIG. 5C, by deleting the redundant circuit.

In step 56 in FIG. 3A, pseudo faults are set in the selected internal node, when the output data DO1 and DO2 coincide in step 58 concerning both pseudo faults "1" and "0", process based on only one of the pseudo faults is executed, i.e. the selected internal node and one of the set pseudo faults are stored.

In the above description, if the output data DO1 and DO2 coincide in step 58, the existence of a redundant circuit is determined. As already described, it provides a great advantage to detect a redundant circuit completely and delete the detected redundant circuit, because much labor or limitations are necessary in order to detect faults in the redundant circuit in the logic circuit. By deleting the redundant circuit completely from the designed logic circuit, test data for fault simulation will not be necessary. Additionally, it is pointed out that the designed logic circuit is free from the influence of the fault existing in the redundant circuit. The complete detection of the faults therefore can be carried out in the designed logic circuit. Furthermore, the deletion of the redundant circuit permits the optimization of the designed logic circuit thereby providing high-density integration of a semiconductor integrated circuit.

Details on the deletion process of the redundant circuit in step 62 are seen in an article by Kakinuma et al entitled "Integrated CAD System for Custom LSI (2), Hierarchy Directional Data Base", presented at the 25th (the latter half of 1982) National Convention of Information Processing Society of Japan, pp. 1281–1282. The detailed description of the process is also seen in an article by Kakinuma et al entitled "Outline of Data Base Pointed to Hierarchy Design and Process by Hierarchy Development" included in material 14-4 presented at the meeting of the study on design automation held by Information Processing Society of Japan (issued on Oct. 28, 1982).

Figure 3C:
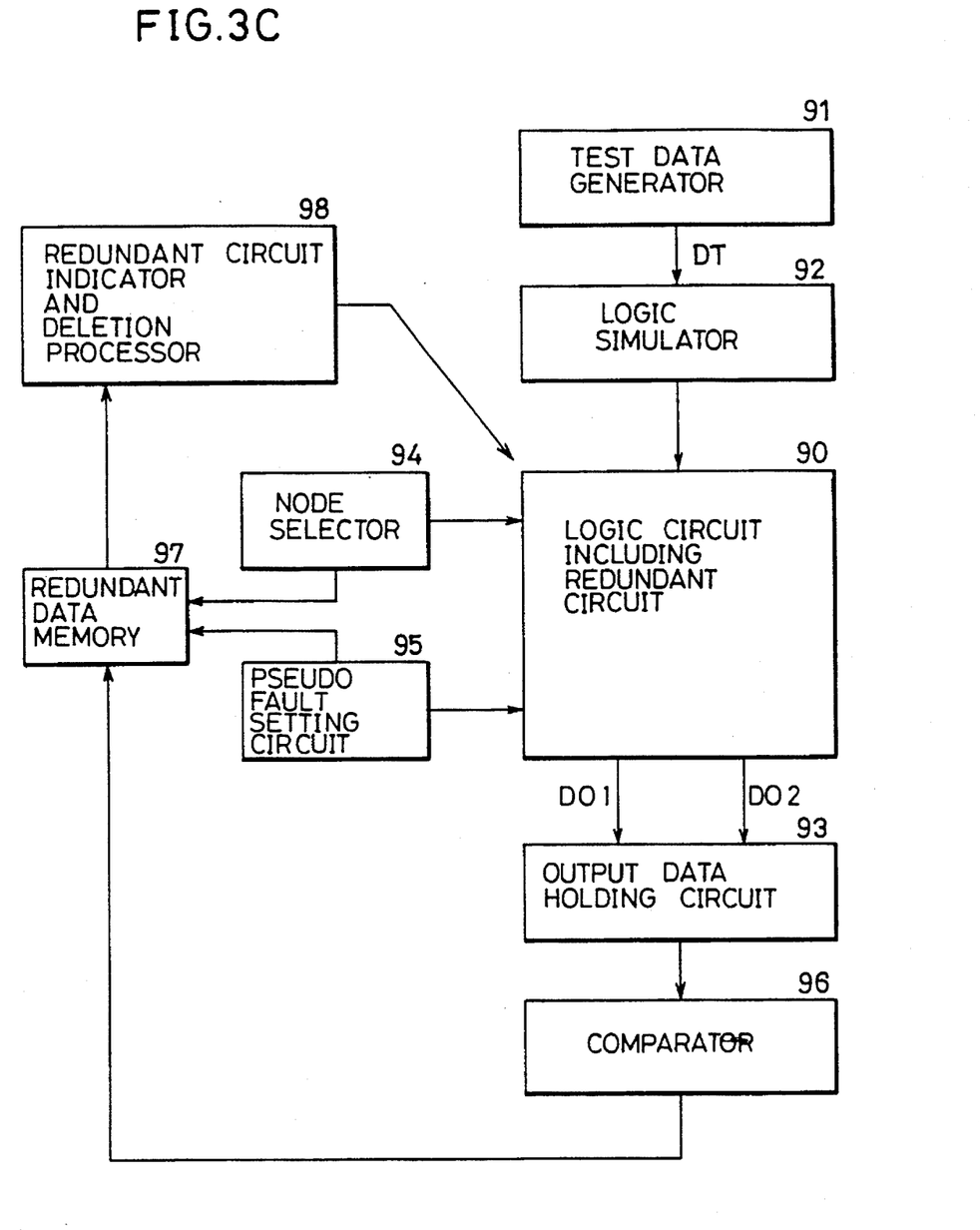
FIG. 3C is a block diagram of a redundant circuit detecting apparatus representing one embodiment of the present invention.

Referring to FIG. 3C, description will be given on a redundant circuit detecting apparatus representing another embodiment of the present invention. The apparatus is capable of detecting a redundant circuit existing within a wired logic circuit 90. The redundant circuit detecting apparatus comprises a test data generator 91, a logic simulator 92 for executing logic simulation of the logic circuit 90 in a designed logic circuit (including a redundant circuit) using the test data, an output data holding circuit 93 for holding output data DO1 and DO2 representing the simulation result, a node selector 94 for selecting an internal node in the logic circuit 90, pseudo fault setting circuit 95 for setting a pseudo fault in the selected internal node, a comparator 96 for comparing the two output data DO1 and DO2, a redundant circuit data memory 97 for storing the internal node data and the pseudo fault data when the output data DO1 and DO2 coincide, and a redundant circuit indicator and deletion processor 98 for indicating a redundant circuit and deleting the same when the existence of the redundant circuit is detected.

The operation of the redundant circuit detecting apparatus shown in FIG. 3C is identical to that shown in FIGS. 3A and 3B and, therefore, the description thereof is omitted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A redundant circuit detecting apparatus for detecting a redundant circuit in a logic circuit including said redundant circuit, comprising:

first logic simulation executing means for executing logic simulation of said logic circuit using prescribed test data, said first logic simulation executing means generating first output data based on the prescribed test data applied to prescribed input nodes of the logic circuit;

internal node selecting means for selecting one internal node in said logic circuit;

pseudo fault setting means for setting a pseudo fault at the selected internal node in said logic circuit;

second logic simulation executing means for executing logic simulation of said logic circuit including said pseudo fault, using said prescribed test data, said second logic simulation executing means generating second output data based on the same prescribed test data, which was used by the first logic simulation executing means, applied at the same prescribed input nodes of the logic circuit; and coincidence detecting means for detecting the coincidence between said first and second output data, said redundant circuit being responsive to said coincidence detecting means and determined to be connected to said internal node.

2. The redundant circuit detecting apparatus in accordance with claim 1, wherein said pseudo fault setting means comprises fixed logic voltage applying means for applying a voltage of a fixed logic level to the selected internal node in said logic circuit.

3. The redundant circuit detecting apparatus in accordance with claim 2, wherein said logic circuit comprises a binary logic circuit for processing logics "1" and "0", and the voltage of said fixed logic level comprises a voltage representing at least one of the logics "1" and "0".

4. The redundant circuit detecting apparatus in accordance with claim 1, wherein said logic circuit comprises a first logic circuit portion for providing a logic signal to said selected internal node, and a second logic circuit portion connected to receive the logic signal provided by said first logic circuit portion through said selected internal node, said first logic circuit portion being determined to be said redundant circuit when said coincidence detecting means detects coincidence between said first and second output data.

5. A logic circuit optimizing apparatus for optimizing a logic circuit including a redundant circuit, comprising:

first logic simulation executing means for executing logic simulation of said logic circuit using prescribed test data, said first logic simulation executing means generating first output data based on the prescribed test data applied to prescribed input nodes of the logic circuit;

internal node selecting means for selecting one internal node in said logic circuit;

pseudo fault setting means for setting a pseudo fault at the selected internal node in said logic circuit;

second logic simulation executing means for executing logic simulation of said logic circuit including said pseudo fault, using said prescribed test data, said second logic simulation executing means generating second output data based on the same prescribed test data, which was used by the first logic simulation executing means, applied at the same prescribed input nodes of the logic circuit;

coincidence detecting means for detecting the coincidence between said first and second output data; and deleting means for deleting a circuit portion as said redundant circuit which supplies an output signal to said internal node.

6. A method of detecting a redundant circuit in a logic circuit including said redundant circuit, comprising the steps of:

executing logic simulation of said logic circuit using prescribed test data to generate first output data based on the prescribed test data applied to prescribed input nodes of the logic circuit;

selecting one internal node in said logic circuit;

setting a pseudo fault at the selected internal node in said logic circuit;

executing logic simulation of said logic circuit including said pseudo fault using said prescribed test data to generate second output data based on the same prescribed test data, which was used to generate the first output data, applied at the same prescribed input nodes of the logic circuit;

detecting the coincidence between said first and second output data; and processing said redundant circuit as connected to said internal node in response to coincidence between said first and second output data in said coincidence detecting step.

7. A method of optimizing a logic circuit including a redundant circuit, comprising the steps of:

executing logic simulation of said logic circuit, using prescribed test data, to generate first output data based on the prescribed test data, applied to prescribed input nodes of the logic circuit;

selecting one internal node in said logic circuit;

setting a pseudo fault at the selected internal node in said logic circuit;

executing logic simulation of said logic circuit including said pseudo fault, using said prescribed test data, to generate second output data based on the same prescribed test data, which was used to generate the first output data, applied at the same prescribed input nodes of the logic circuit;

detecting the coincidence between said first and second output data; and deleting the circuit portion supplying an output signal to said internal node as said redundant circuit, in response to the coincidence detection.

8. A detecting apparatus for detecting the data of a redundant circuit by processing electronic data related to the design of a logic circuit including said redundant circuit, comprising:

test data generating means for generating prescribed test data;

logic simulation executing means for executing logic simulation of said logic circuit, using said prescribed test data applied to prescribed input nodes of the logic circuit, to output first output data indicating the result of the simulation;

internal node selecting means for selecting one internal node in said logic circuit;

pseudo fault setting means for setting a pseudo fault in the selected internal node;

said logic simulation executing means executing logic simulation of said logic circuit including said pseudo fault, using the same prescribed test data, which was used to generate said first output data, applied at the same prescribed input nodes of the logic circuit to output second output data indicating the result of the simulation; and coincidence detecting means for detecting the coincidence between said first and second output data, the data of said redundant circuit being responsive to said coincidence detecting means to output data indicating that said redundant circuit is connected to said internal node.

9. The detecting apparatus in accordance with claim 8, further comprising indicating means responsive to said coincidence detecting means for indicating said redundant circuit being connected to said internal node.

10. The detecting apparatus in accordance with claim 8, further comprising deleting means responsive to said coincidence detecting means for deleting said redundant circuit connected to said internal node.

* * * * *